United States Patent
Choi et al.

(10) Patent No.: US 10,658,551 B2
(45) Date of Patent: May 19, 2020

(54) WAVELENGTH-CONVERTING FILM AND SEMICONDUCTOR LIGHT EMITTING APPARATUS HAVING THE SAME

(71) Applicant: Samsung Electronics Co., Ltd., Suwon-si, Gyeonggi-do (KR)

(72) Inventors: Sung Woo Choi, Suwon-si (KR); Jeong Rok Oh, Suwon-si (KR); Jeong Eun Yun, Hwaseong-si (KR); Chul Soo Yoon, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/043,546

(22) Filed: Jul. 24, 2018

(65) Prior Publication Data

US 2019/0189863 A1 Jun. 20, 2019

(30) Foreign Application Priority Data

Dec. 20, 2017 (KR) .......................... 10-2017-0176555

(51) Int. Cl.
*H01L 33/50* (2010.01)
*H01L 33/60* (2010.01)
*H01L 33/64* (2010.01)
*H01L 33/42* (2010.01)
*C04B 35/64* (2006.01)
*H01L 33/06* (2010.01)
(Continued)

(52) U.S. Cl.
CPC .............. *H01L 33/501* (2013.01); *C03C 8/08* (2013.01); *C03C 8/14* (2013.01); *C03C 14/006* (2013.01); *C04B 35/64* (2013.01); *H01L 23/08* (2013.01); *H01L 33/06* (2013.01); *H01L 33/42* (2013.01); *H01L 33/50* (2013.01); *H01L 33/504* (2013.01); *H01L 33/505* (2013.01); *H01L 33/56* (2013.01); *H01L 33/60* (2013.01); *H01L 33/64* (2013.01); *B82Y 20/00* (2013.01); *C03C 3/062* (2013.01); *C03C 2214/05* (2013.01); *C03C 2214/16* (2013.01); *G02B 6/0023* (2013.01); *G02B 6/0073* (2013.01); *H01L 33/502* (2013.01); *H01L 33/507* (2013.01)

(58) Field of Classification Search
CPC ..... H01L 33/50; H01L 33/501; H01L 33/502; H01L 33/504; H01L 33/505; H01L 33/507; H01L 33/508; H01L 2933/0041
See application file for complete search history.

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

KR 10-1762223 B1 7/2017

*Primary Examiner* — Eduardo A Rodela
(74) *Attorney, Agent, or Firm* — Harness, Dickey & Pierce, P.L.C.

(57) ABSTRACT

A wavelength-converting film includes a sintered body formed of a mixture of a wavelength-converting material and a glass composition. The wavelength-converting material includes a quantum dot having a core-shell structure and a protective layer coating a surface of the quantum dot. A shell of the quantum dot contains at least one of Zn, S, and Se, the protective layer does not contain S and Se, and the glass composition includes a $SnO_2$—$P_2O_5$—$SiO_2$-based composition.

20 Claims, 10 Drawing Sheets

(51) Int. Cl.
  *C03C 14/00* (2006.01)
  *C03C 8/08* (2006.01)
  *C03C 8/14* (2006.01)
  *H01L 33/56* (2010.01)
  *H01L 23/08* (2006.01)
  *F21V 8/00* (2006.01)
  *B82Y 20/00* (2011.01)
  *C03C 3/062* (2006.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 9,484,504 B2 | 11/2016 | Bibl et al. | |
| 9,761,768 B2 | 9/2017 | Schricker et al. | |
| 2010/0289044 A1 | 11/2010 | Krames et al. | |
| 2013/0194783 A1 | 8/2013 | Kang | |
| 2015/0008816 A1 | 1/2015 | Yoon et al. | |
| 2015/0340574 A1* | 11/2015 | Tamaki | H01L 33/505 257/98 |
| 2016/0084476 A1* | 3/2016 | Koole | C09K 11/02 362/84 |
| 2016/0104825 A1 | 4/2016 | Sato | |
| 2016/0181482 A1 | 6/2016 | Borrelli et al. | |
| 2016/0225944 A1* | 8/2016 | Nishimura | H01L 33/0095 |
| 2016/0300985 A1 | 10/2016 | Gootz et al. | |
| 2017/0033267 A1* | 2/2017 | Tamaki | H01L 33/502 |
| 2017/0047489 A1 | 2/2017 | Fan | |
| 2017/0074485 A1 | 3/2017 | Lee et al. | |
| 2017/0148961 A1 | 5/2017 | Tong et al. | |
| 2017/0190609 A1 | 7/2017 | Aitken et al. | |
| 2017/0211756 A1* | 7/2017 | Koole | C09K 11/02 |
| 2017/0271562 A1 | 9/2017 | Wang et al. | |
| 2018/0088268 A1* | 3/2018 | Kondo | C03C 3/091 |

* cited by examiner

A-A'

WAVELENGTH-CONVERTING FILM AND SEMICONDUCTOR LIGHT EMITTING APPARATUS HAVING THE SAME

CROSS-REFERENCE TO RELATED APPLICATION(S)

This application claims benefit of priority to Korean Patent Application No. 10-2017-0176555 filed on Dec. 20, 2017 in the Korean Intellectual Property Office, the disclosure of which is incorporated herein by reference in its entirety.

BACKGROUND

1. Field

The present disclosure relates to a wavelength-converting film including a glass composition. More particularly, the present inventive concept relates to a wavelength-converting film and a semiconductor light emitting apparatus using the same.

2. Description of Related Art

In general, wavelength-converting materials such as fluorescent substances convert light generated by a specific light source and having a specific wavelength into light having a different wavelength. Such wavelength-converting materials may be combined with various forms of light sources to be widely used as a technique for providing second light having a different wavelength from first light.

Recently, wavelength-converting materials have been used in combination with semiconductor light emitting devices emitting monochromatic light. In particular, since semiconductor light emitting devices not only operate at lower power but also have excellent optical efficiency, semiconductor light emitting devices have been advantageously used as alternative light sources in LCD backlights, automobile lights, and household lighting apparatuses.

Normally, a wavelength-converting material, such as a quantum dot or a ceramic fluorescent substance, may be used by being mixed with a molding resin disposed around the semiconductor light emitting devices, or may be directly applied to a chip surface. In this case, the wavelength-converting material may be deteriorated and/or discolored due to high-energy short-wavelength light emitted by the semiconductor light emitting devices and heat generated in the semiconductor light emitting devices, such that reliability problems may occur.

SUMMARY

An aspect of the present inventive concepts is to provide a wavelength-converting film in which quantum dots sensitive to environmental conditions (e.g. oxygen, moisture, and heat) are not deteriorated or discolored and wavelength-converting characteristics are more stably maintained.

Another aspect of the present inventive concepts is to provide a semiconductor light emitting apparatus including the wavelength-converting film.

According to an example embodiment, a wavelength-converting film includes a sintered body formed of a mixture of a wavelength-converting material and a glass composition. The wavelength-converting material includes a quantum dot having a core-shell structure and a protective layer coating a surface of the quantum dot. A shell of the quantum dot contains at least one of Zn, S, and Se, the protective layer does not contain S or Se, and the glass composition includes a $SnO_2$—$P_2O_5$—$SiO_2$-based composition.

According to an example embodiment, a method of fabricating a wavelength-converting film includes forming a $SnO_2$—$P_2O_5$—$SiO_2$-based glass composition, forming a molded article with a mixture of the glass composition and a wavelength-converting material, and sintering the molded article at a temperature of about 300° C. or lower. The wavelength-converting material includes a quantum dot having a core-shell structure and a protective layer coating a surface of the quantum dot. A shell of the quantum dot contains at least one of Zn, S, and Se, and the protective layer does not contain S or Se.

According to an example embodiment, a semiconductor light emitting device includes first and second electrode structures, a semiconductor light-emitting diode chip electrically connected to the first and second electrode structures and emitting first light having a peak wavelength in a range of 440 nm to 460 nm, and a wavelength-converting film disposed on a path of light generated in the semiconductor light-emitting diode chip and including a sintered body formed of a mixture of a wavelength-converting material configured to convert first light into second light having a different wavelength and a glass composition. The wavelength-converting material includes a quantum dot having a core-shell structure and a protective layer coating a surface of the quantum dot. A shell of the quantum dot contains at least one of Zn, S, and Se, the protective layer does not contain S or Se, and the glass composition includes a $SnO_2$—$P_2O_5$—$SiO_2$-based composition.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments will be described with reference to the accompanying drawings.

Figure 1:
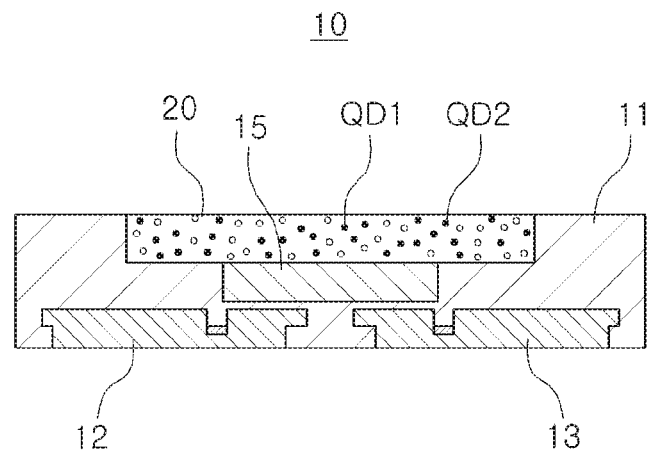
FIG. 1 is a side cross-sectional view of a semiconductor light emitting device according to an example embodiment.
Figure 2:
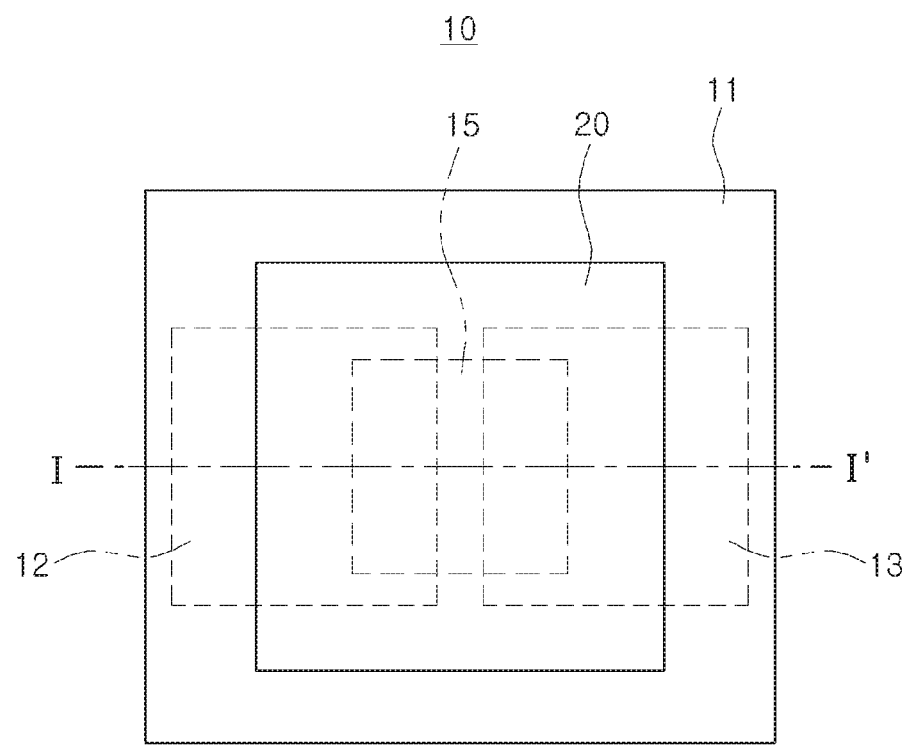
FIG. 2 is a plan view of the semiconductor light emitting device illustrated in FIG. 1.

FIG. 1 is a side cross-sectional view of a semiconductor light emitting device according to an example embodiment, and FIG. 2 is a plan view of the semiconductor light emitting device illustrated in FIG. 1.

Referring to FIGS. 1 and 2, a semiconductor light emitting device 10 according to example embodiments may include a package body 11, a semiconductor light emitting diode chip 15, and a wavelength-converting film 20.

In example embodiments, the semiconductor light emitting diode chip 15 may be disposed on first and second electrode structures 12 and 13, such as a lead frame. The semiconductor light emitting diode chip 15 may have a flip-chip structure (please refer to FIGS. 6 and 7), but is not limited thereto. The semiconductor light emitting diode chip 15 may be an LED chip configured to emit ultraviolet light, near-UV light, or blue light. For example, the semiconductor light emitting diode chip 15 may emit first light having a peak wavelength in a range of 440 nm to 460 nm.

The wavelength-converting film 20 may be disposed in a path of light emitted by the semiconductor light emitting diode chip 15. In example embodiments, the wavelength-converting film 20 may be disposed on a surface of the semiconductor light emitting diode chip 15. The semiconductor light emitting device 10 may include an additional adhesion layer disposed between the wavelength-converting film 20 and the semiconductor light emitting diode chip 15, but is not limited thereto. The wavelength-converting film 20 and the semiconductor light emitting diode chip 15 may be combined by the package body 11.

Figure 3:
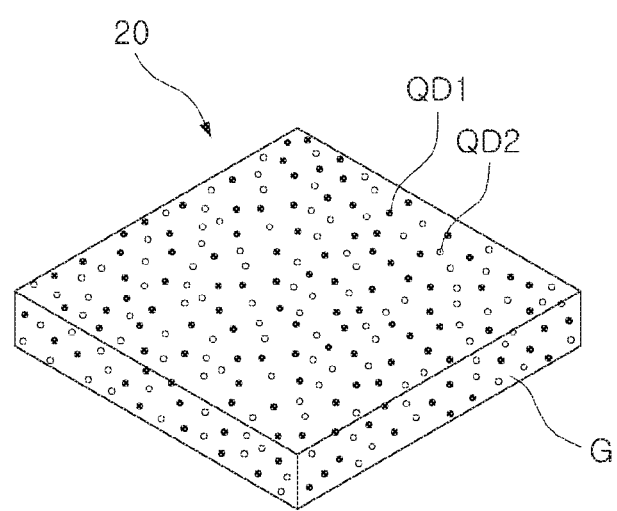
FIG. 3 is a schematic perspective view of a wavelength-converting film according to an example embodiment.

The wavelength-converting film 20 may be a wavelength-converting material, and include one or more first and second quantum dots QD1 and QD2. Each of the one or more first and second quantum dots QD1 and QD2 may have a core-shell structure including an III-V or II-VI compound semiconductor material. As illustrated in FIG. 3, the wavelength-converting film 20 may be formed of a glass sintered body G containing one or more of the first and second quantum dots QD1 and QD2.

The one or more first and second quantum dots QD1 and QD2 may be configured such that light emitted by the semiconductor light emitting diode chip 15 is converted into light having different wavelengths. The one or more first and second quantum dots QD1 and QD2 according to example embodiments may be quantum dots selected from the group consisting of InP/ZnS, InP/ZnSe, CdSe/CdS, CdSe/ZnS, PbS/ZnS, and InP/GaP/ZnS.

In example embodiments, the light generated in the semiconductor light emitting diode chip 15 may be blue light. In example embodiments, the first and second quantum dots QD1 and QD2 may include a green quantum dot and a red quantum dot.

Since the glass sintered body G making up the wavelength-converting film 20 is hardly deteriorated at high temperatures, it may be advantageously used as a matrix or a binder for forming the wavelength-converting material. The glass sintered body G for forming the wavelength-converting film 20 may be a material capable of being sintered at a low temperature and ensuring a high light transmittance. The glass sintered body G according to example embodiments may include a $SnO_2$—$P_2O_5$—$SiO_2$-based glass composition. For example, a transition temperature Tg of the glass composition may be in a range of 100° C. to 250° C., and a molding temperature Tw of the glass composition may be in a range of 150° C. to 400° C.

Since the glass composition is sintered at about 250° C. or lower, deterioration of the wavelength-converting material, such as first and second quantum dots QD1 and QD2, may be sufficiently reduced or prevented during the sintering process for forming the wavelength-converting film 20.

In some example embodiments, the glass composition may include $SnO_2$ in an amount of 25 to 95 wt %, $P_2O_5$ in an amount of 5 to 70 wt %, and $SiO_2$ in an amount of 1 to 30 wt %, based on the total weight of the glass composition. In addition, the glass composition may include at least one component selected from the group consisting of $Na_2O$, MgO, $Al_2O_3$, CaO, $K_2O$, and $Li_2O$ in an amount of 10 wt % or less.

The glass composition of the wavelength-converting film 20 according to example embodiments may include a tin (Sn) component as a condition for sintering at a low temperature. However, Sn may easily react with sulfur (S) or selenium (Se) contained in a shell of the first and second quantum dots QD1 and QD2. When a temperature increases during the sintering process, Sn ions in glass may react with S and Se on a surface of the glass and form black and brown SnS and SnSe compounds. Accordingly, even if the deterioration occurring due to the sintering temperature is reduced or prevented, the first and second quantum dots QD1 and QD2 may be deteriorated and discolored due to the chemical reaction with Sn and lose light-converting characteristics.

Figure 4A:
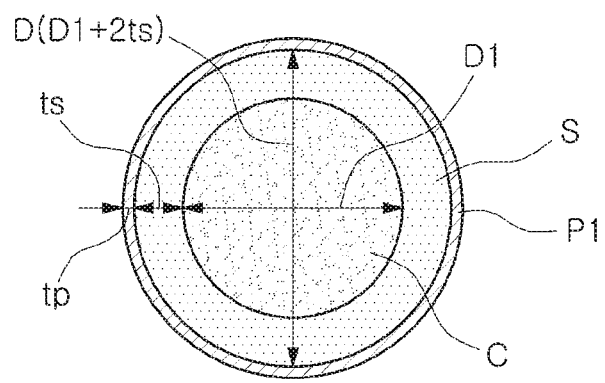
FIGS. 4A and 4B are schematic diagrams illustrating a quantum dot included in a wavelength-converting film according to an example embodiment.
Figure 4B:
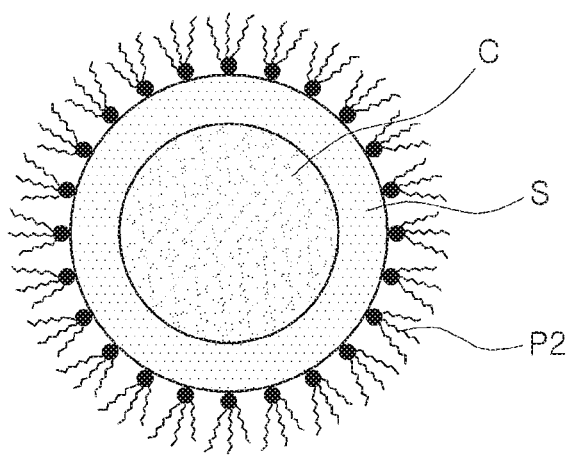

In order to avoid such undesirable reactions, the first and second quantum dots QD1 and QD2 according to example embodiments may include protective layers P1 and P2 in which neither S nor Se are contained, as illustrated in FIGS. 4A and 4B. The protective layers P1 and P2 may include an inorganic coating material such as an oxide or a nitride, or an organic coating material. The Sn component of the wavelength-converting film 20 may easily react with sulfur (S) or selenium (Se) contained in a shell of the first and second quantum dots QD1 and QD2. Accordingly, even if the deterioration occurring due to the sintering temperature can be reduced or prevented, the first and second quantum dots QD1 and QD2 may be deteriorated and discolored due to the chemical reaction with Sn and lose light-converting characteristics.

FIGS. 4A and 4B are schematic diagrams illustrating quantum dots included in the wavelength-converting film 20 according to an example embodiment.

First, the quantum dot illustrated in FIG. 4A may include a core C formed of, for example, CdSe or InP, and a shell S formed of, for example, ZnS or ZnSe. The protective layer P1 of the quantum dot may be an inorganic protective layer, and may include, for example, an oxide or a nitride selected from the group consisting of $SiO_2$, $Al_2O_3$, ZnO, $SiO_xN_y$, and $Si_3N_4$. The protective layer P1 may reduce or prevent the quantum dot from being in direct contact with the Sn component of the wavelength-converting film 20, and the Sn component from reacting with S or Se contained in the shell S of the first and second quantum dots QD1 and QD2.

A process of forming the inorganic protective layer may be performed in a solution state in which the quantum dot is synthesized, or after completing the synthesis of the quantum dot. A thickness tp of the oxide layer or the nitride layer may be in a range of several nanometers to 1 μm. Here, a nanometer-scale coating layer may serve as a protective layer of an individual quantum dot (please refer to FIG. 4A), and a micrometer-scale coating layer may serve as a protective layer of an aggregation including several to dozens of quantum dots.

In another example embodiment, the protective layer P2 of the quantum dot illustrated in FIG. 4B may be an organic protective layer, and may include, for example, poly(ethylene-co-acrylic acid) or poly(methyl methacrylate) (PMMA).

More specifically, the organic protective layer P2 may include a hydrophobic organic material physically adsorbed on a surface of the shell S of the quantum dot. The organic protective layer P2 may include an organic compound having at least one functional group of a carboxyl group (—COOH) and an amine group (—NH$_2$) and having a carbon number of 4 to 18. The organic protective layer P2 may be formed of an organic compound having light transmittance in a form of a thick film (for example, 1 μm or more).

A process of forming the organic protective layer may include, for example, separating an organic solvent containing a synthesized quantum dot in a specific concentration to be dispersed into toluene, which is performed in a nitrogen (N$_2$) atmosphere so as to reduce or minimize the quantum dot being in contact with oxygen. For example, the process of forming the organic protective layer may be performed in a vacuum atmosphere, while the nitrogen (N$_2$) atmosphere may be maintained in an inner container. The process of forming the organic protective layer may include injecting an additive and quantum dots and injecting polyethylene acrylic acid, and may be performed at a temperature between 50° C. and 100° C. Here, at least one of SiO$_2$, TiO$_2$, Al$_2$O$_3$, and ZnO may be added into the organic material to improve dispersibility and reduce surface stickiness of the organic material, and the content thereof may be adjusted in a range between 25 to 75 wt %. After forming the organic protective layer, a cooling process may be performed and the powdery compound in a hexane solvent may be dried and classified in vacuum atmosphere.

A wavelength converted by a quantum dot according to example embodiments may be varied by controlling a diameter (D) of the quantum dot. For example, referring to FIG. 4A, a diameter D1 of the core C may be in a range of 1 nm to 30 nm, and more specifically in a range of 3 nm to 10 nm, and a thickness is of the shell S may be in a range of 0.1 nm to 20 nm, and more specifically in a range of 0.5 nm to 2 nm. By controlling the diameter (D) of the quantum dot, the converted wavelength may be varied between 510 nm (green) and 660 nm (red). Thus, various colors depending on diameters of the quantum dots may be implemented, and a narrow full width at half maximum (FWHM) (e.g. about 35 nm) may be implemented.

The quantum dots according to example embodiments may serve to implement various colors depending on sizes thereof. In particular, the quantum dots may be used as a red fluorescent substance or a green fluorescent substance when used as a substitute for a fluorescent substance. By using the quantum dots, a narrow full width at half maximum (FWHM) (e.g. about 35 nm) may be implemented.

Since the wavelength-converting film 20 according to example embodiments is manufactured in sheet form or plate form beforehand, it may be easily formed to have a uniform thickness. For example, the wavelength-converting film 20 may be processed to have a preferred or desired thickness, and a grinding or polishing process may be additionally performed to form a mirror-like surface of the wavelength-converting film 20.

The package body 11 according to example embodiments may include the semiconductor light emitting diode chip 15 and the first and second electrode structures 12 and 13.

The package body 11 may include a transparent resin and a reflective ceramic powder contained in the transparent resin. For example, the transparent resin may include a silicone resin, an epoxy resin, or combinations thereof. The reflective ceramic powder may include at least one selected from the group consisting of TiO$_2$, BN, Al$_2$O$_3$, Nb$_2$O$_5$, and ZnO. The package body 11 may include an additional ceramic powder having a thermal conductivity of 1 W/m·k or more so as to improve heat dissipating properties.

As illustrated in FIGS. 1 and 2, the package body 11 may be configured to surround the wavelength-converting film 20 as well as the semiconductor light emitting diode chip 15 and the first and second electrode structures 12 and 13. More specifically, the package body 11 may surround the wavelength-converting film 20, and a surface of the wavelength-converting film 20 may be exposed on an upper surface of the package body 11. Accordingly, a path of light may be configured such that the light emitted by the semiconductor light emitting diode chip 15 can be externally extracted via the wavelength-converting film 20.

Figure 5:
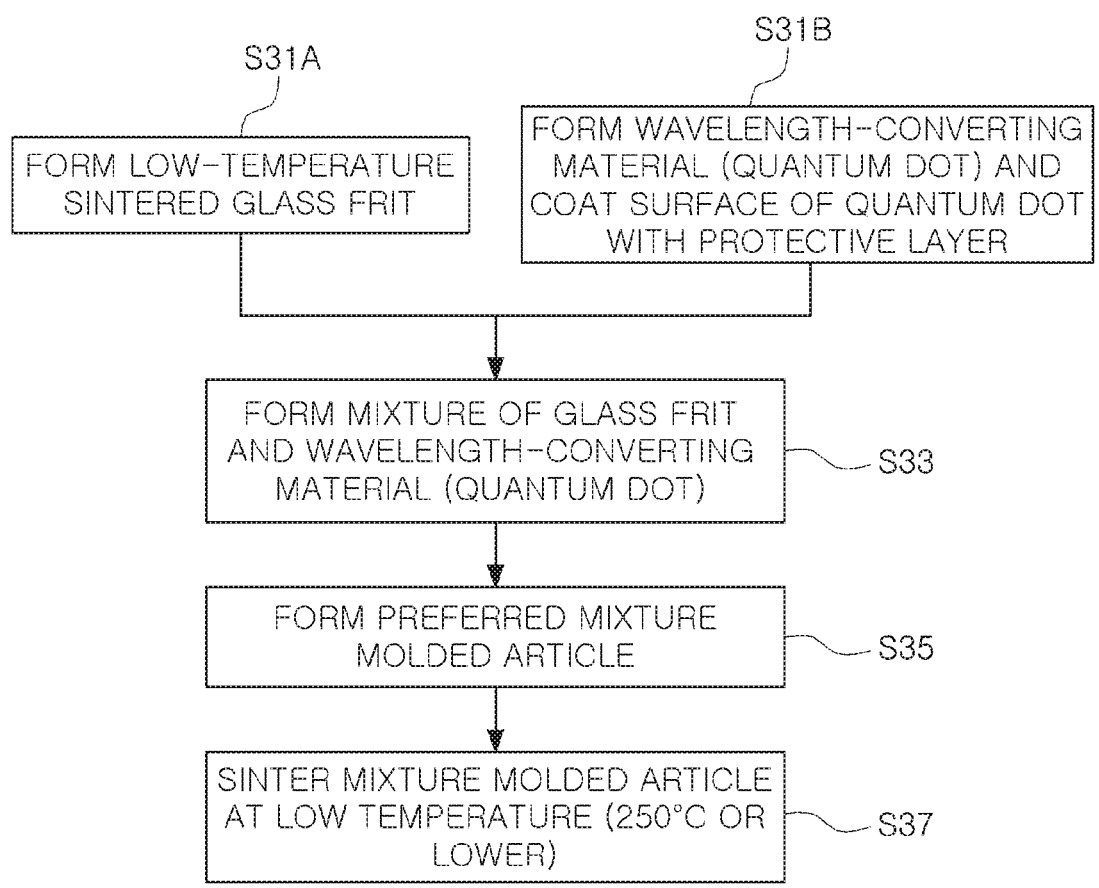
FIG. 5 is a process flowchart provided to illustrate a method of fabricating a wavelength-converting film according to an example embodiment.

FIG. 5 is a process flowchart provided to illustrate a method of fabricating a wavelength-converting film according to an example embodiment.

First, the method of fabricating the wavelength-converting film may include forming a low-temperature sintered glass frit (the operation S31A) and forming a quantum dot having a protective layer formed on a surface thereof (the operation S31B).

The glass frit may be a SnO$_2$—P$_2$O$_5$—SiO$_2$-based composition. In some example embodiments, the composition of the glass frit may include SnO$_2$ in an amount of 25 to 95 wt %, P$_2$O$_5$ in an amount of 5 to 70 wt %, and SiO$_2$ in an amount of 1 to 30 wt %, based on the total weight of the glass composition. An additive formed of at least one selected from the group consisting of Na$_2$O, CaO, K$_2$O, and Li$_2$O may be present in an amount of 10 wt % or less. A transition temperature Tg of the glass frit may be in a range of 100° C. to 300° C., and a molding temperature Tw of the glass frit may be in a range of 150° C. to 400° C.

As described above, the wavelength-converting material may include the quantum dot having a core-shell structure, and a protective layer may be formed on a surface of the quantum dot. A shell of the quantum dot may include at least one of Zn, S, and Se, and the protective layer may include neither S nor Se. The protective layer of the quantum dot may be an organic protective layer such as polyethylene acrylic acid or PMMA, or an inorganic protective layer such as an oxide or a nitride.

Next, the wavelength-converting material including the glass composition and the quantum dot may be mixed to form a mixture in operation S33.

The glass composition may include the wavelength-converting material and a binder, mixed in a solvent. The binder may function to bind the glass composition and the wavelength-converting material. The binder may be an organic binder formed of at least one selected from the group consisting of cellulose resin, acrylic resin, butyl carbitol, and terpineol, but is not limited thereto.

Next, in the operation S35, the mixture may be molded into a preferred or desired shape to form a mixture molded article.

The molding process may be a process of forming a sheet or a plate. Since a length of a wavelength conversion path may be one important factor that determines a preferred or desired degree of the wavelength conversion, the preferred or desired degree of the wavelength conversion may be implemented by appropriately setting a thickness of the wavelength-converting film. The mixture may be molded into various shapes using an appropriate mold structure as necessary.

Next, in the operation S37, the mixture molded article may be sintered at a low temperature to fabricate the wavelength-converting film having a preferred or desired shape.

Since the mixture molded article uses the low-temperature sintered glass frit, the sintering process may be performed at a low temperature (e.g. about 300° C. or lower) that does not cause deterioration of the wavelength-converting material. Not only thermal degradation of the quantum dot may be reduced or prevented by virtue of the process of sintering at the low-temperature, but also the quantum dot having low moisture resistance and low thermal stability may be effectively utilized by using a highly reliable system (the sintered glass).

In addition, although the glass composition of the wavelength-converting film according to example embodiments includes the Sn component as a condition for sintering at the low temperature and the shell of the quantum dot includes S or Se that reacts with the Sn component, the chemical reaction between the quantum dot and the Sn component may be reduced or prevented by the protective layer formed beforehand.

Figure 6:
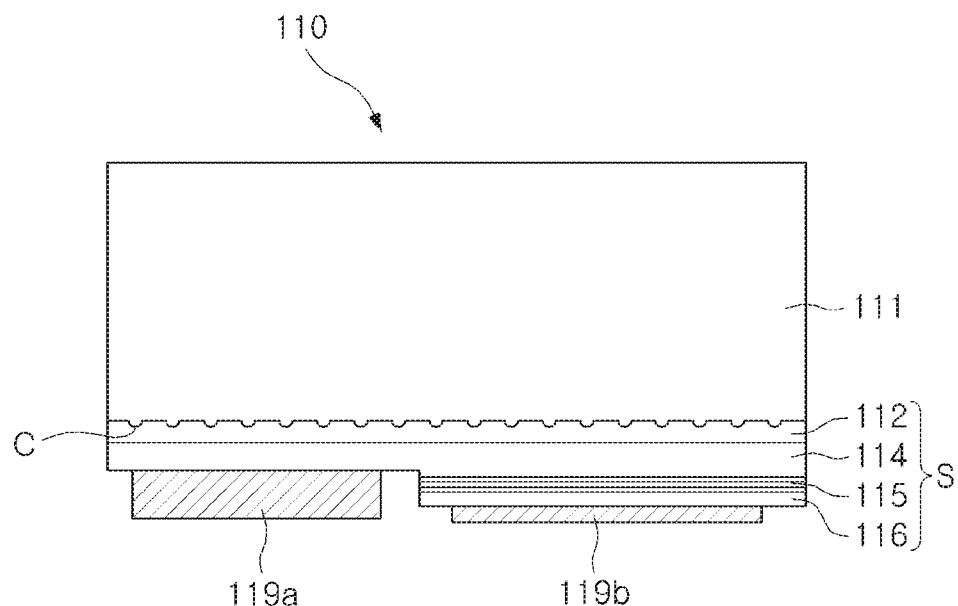
FIGS. 6 and 7 are side cross-sectional views of various semiconductor light emitting diode chips according to example embodiments.
Figure 7:
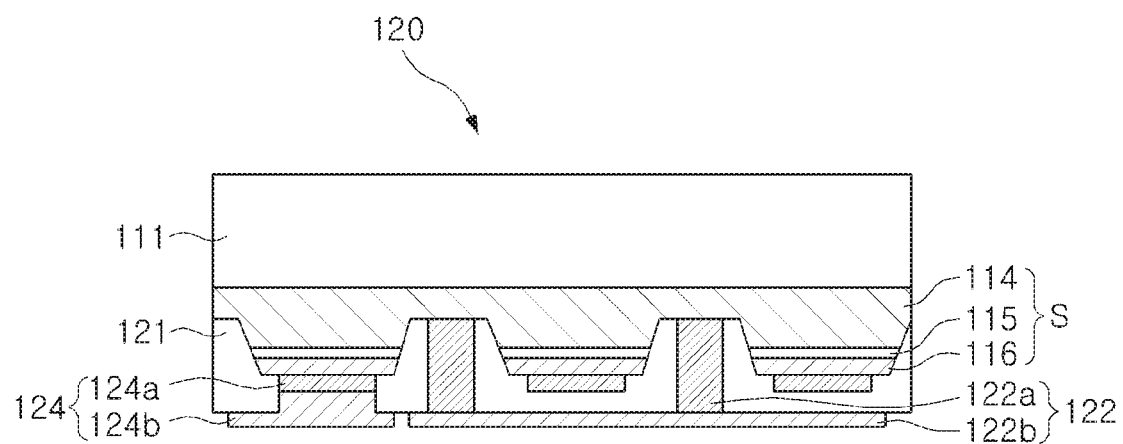

The semiconductor light emitting device according to example embodiments may include various forms of semiconductor light emitting diode chips. FIGS. 6 and 7 are side cross-sectional views of various semiconductor light emitting diode chips according to example embodiments.

Referring to FIG. 6, a semiconductor light emitting diode chip 110 according to example embodiments may include a substrate 111 and a semiconductor stack S stacked on the substrate 111. The semiconductor stack S may include a first conductivity-type semiconductor layer 114, an active layer 115, and a second conductivity-type semiconductor layer 116, sequentially stacked on the substrate 111. A buffer layer 112 may be interposed between the substrate 111 and the first conductivity-type semiconductor layer 114.

The substrate 111 may be an insulating substrate such as sapphire, but is not limited thereto. The substrate 111 may be a conductive substrate or a semiconductor substrate, instead of the insulating substrate. For example, the substrate 111 may be SiC, Si, $MgAl_2O_4$, MgO, $LiAlO_2$, $LiGaO_2$, or GaN, instead of sapphire. Concavities C may be formed on an upper surface of the substrate 111. The concavities C may serve to improve light extraction efficiency and quality of a single crystal to be grown on the upper surface of the substrate 111.

The buffer layer 112 may be $In_xAl_yGa_{1-x-y}N$ ($0 \leq x \leq 1$ and $0 \leq y \leq 1$). For example, the buffer layer 112 may be GaN, AlN, AlGaN, or InGaN. As necessary, the buffer layer 112 may be formed by combining a plurality of layers or gradually changing a composition thereof.

The first conductivity-type semiconductor layer 114 may be a nitride semiconductor layer satisfying n-type $In_xAl_yGa_{1-x-y}N$ ($0 \leq x < 1$, $0 \leq y < 1$, and $0 \leq x+y < 1$), in which the n-type impurities may be Si. For example, the first conductivity-type semiconductor layer 114 may include n-type GaN. The second conductivity-type semiconductor layer 116 may be a nitride semiconductor layer satisfying p-type $In_xAl_yGa_{1-x-y}N$ ($0 \leq x < 1$, $0 \leq y < 1$, and $0 \leq x+y < 1$), in which the p-type impurities may be Mg. For example, the second conductivity-type semiconductor layer 116 may be formed in a single layer, or in a plurality of layers having different compositions as illustrated in example embodiments.

The active layer 115 may have a multiple quantum well (MQW) structure in which a plurality of quantum well layers and a plurality of quantum barrier layers are alternately stacked. For example, the quantum well layers and the quantum barrier layers may be $In_xAl_yGa_{1-x-y}N$ ($0 \leq x \leq 1$, $0 \leq y \leq 1$, and $0 \leq x+y \leq 1$) having different compositions. In some example embodiments, the quantum well layers may be $In_xGa_{1-x}N$ ($0 < x \leq 1$), and the quantum barrier layers may be GaN or AlGaN. Thicknesses of the quantum well layers and the quantum barrier layers may be respectively in the range between 1 nm to 50 nm. The active layer 115 is not limited to the multiple quantum well (MQW) structure, and may have a single quantum well (SQW) structure.

First and second electrodes 119a and 119b may be respectively disposed on a mesa-etched area of the first conductivity-type semiconductor layer 114 and the second conductivity-type semiconductor layer 116, to be disposed on the same plane (a first plane). The first electrode 119a may include, but is not limited to, Ag, Ni, Al, Cr, Rh, Pd, Jr, Ru, Mg, Zn, Pt, or Au, and may have a single layer or multilayer structure. As necessary, the second electrode 119b may be a transparent electrode, such as a transparent conductive oxide or a transparent conductive nitride, or may include graphene. The second electrode 119b may include at least one of Al, Au, Cr, Ni, Ti, and Sn.

Referring to FIG. 7, a semiconductor light emitting diode chip 120 according to example embodiments may be understood as having a similar structure to the semiconductor light emitting diode chip 110 illustrated in FIG. 6, except electrode structures and other structures related thereto. Accordingly, components of the semiconductor light-emitting diode chip 120 according to example embodiments may be understood with reference to the descriptions of the same or similar components of the semiconductor light emitting diode chip 110 illustrated in FIG. 6, unless described otherwise.

The semiconductor light emitting diode chip 120 may include first and second electrodes 122 and 124 respectively connected to the first conductivity-type semiconductor layer 114 and the second conductivity-type semiconductor layer 116. The first electrode 122 may include a connecting electrode 122a, similar to a conductive via, passing through the second conductivity-type semiconductor layer 116 and the active layer 115 to be connected to the first conductivity-type semiconductor layer 114, and a first electrode pad 122b connected to the connecting electrode 122a. The connecting electrode 122a may be surrounded by an insulating layer 121 to be electrically isolated from the active layer 115 and the second conductivity-type semiconductor layer 116. The connecting electrode 122a may be disposed on an area in which the semiconductor stack S is etched. The number, shape, and pitch of the connecting electrode 122a or a contact area of the connecting electrode 122a with the first conductivity-type semiconductor layer 114 may be appropriately designed to reduce contact resistance. In addition, the connecting electrode 122a may be arranged in rows and columns on the semiconductor stack S, thereby improving current flow. The second electrode 124 may include an ohmic contact layer 124a and a second electrode pad 124b, disposed on the second conductivity-type semiconductor layer 116.

The connecting electrode 122a and the ohmic contact layer 124a may include conductive materials formed in a single layer or multiple layers and having ohmic characteristics with the first and second conductivity-type semiconductor layers 114 and 116, respectively. For example, the connecting electrode 122a and the ohmic contact layer 124a may be formed by depositing or sputtering at least one of a metal, such as Ag, Al, Ni, or Cr and a transparent conductive oxide (TCO), such as indium tin oxide (ITO).

The first and second electrode pad 122*b* and 124*b* may be connected to the connecting electrode 122*a* and the ohmic contact layer 124*a*, respectively, and may function as external terminals of the semiconductor light-emitting diode chip 120. For example, the first and second electrode pad 122*b* and 124*b* may be Au, Ag, Al, Ti, W, Cu, Sn, Ni, Pt, Cr, NiSn, TiW, AuSn, or a eutectic metal thereof.

The first and second electrodes 122 and 124 may be arranged in the same direction, and mounted in the form of a flip chip on a lead frame. The first and second electrodes 122 and 124 may be electrically isolated from each other by the insulating layer 121. The insulating layer 121 may be any material as long as it has electrically insulating properties and a low light absorptivity. For example, the insulating layer 121 may include silicon oxide or silicon nitride. As necessary, a light-reflective structure may be formed by dispersing a light-reflective powder into the light-transmitting material. Alternatively, the insulating layer 121 may have a multilayered reflective structure in which a plurality of insulating layers having different refractive indexes are alternately stacked. For example, the multilayered reflective structure may be a distributed Bragg reflector (DBR) in which a first insulating layer having a first refractive index and a second insulating layer having a second refractive index are alternately stacked.

The multilayered reflective structure may be formed by repeatedly stacking a plurality of insulating layers having different refractive indexes two to 100 times. For example, the plurality of insulating layers may be repeatedly stacked 3 to 70 times and, more specifically, 4 to 50 times. The plurality of insulating layers of the multilayered reflective structure may be an oxide or a nitride, such as $SiO_2$, SiN, $SiO_xN_y$, $TiO_2$, $Si_3N_4$, $Al_2O_3$, TiN, AlN, $ZrO_2$, TiAlN, or TiSiN, or a combination thereof. The refractive indexes of the first insulating layer and the second insulating layer may be in the range between about 1.4 to about 2.5, and may be lower than refractive indexes of the first conductivity-type semiconductor layer 114 and the substrate 111. Alternatively, the refractive indexes of the first insulating layer and the second insulating layer may be lower than the refractive index of the first conductivity-type semiconductor layer 114, but higher than the refractive index of the substrate 111.

Figure 8:
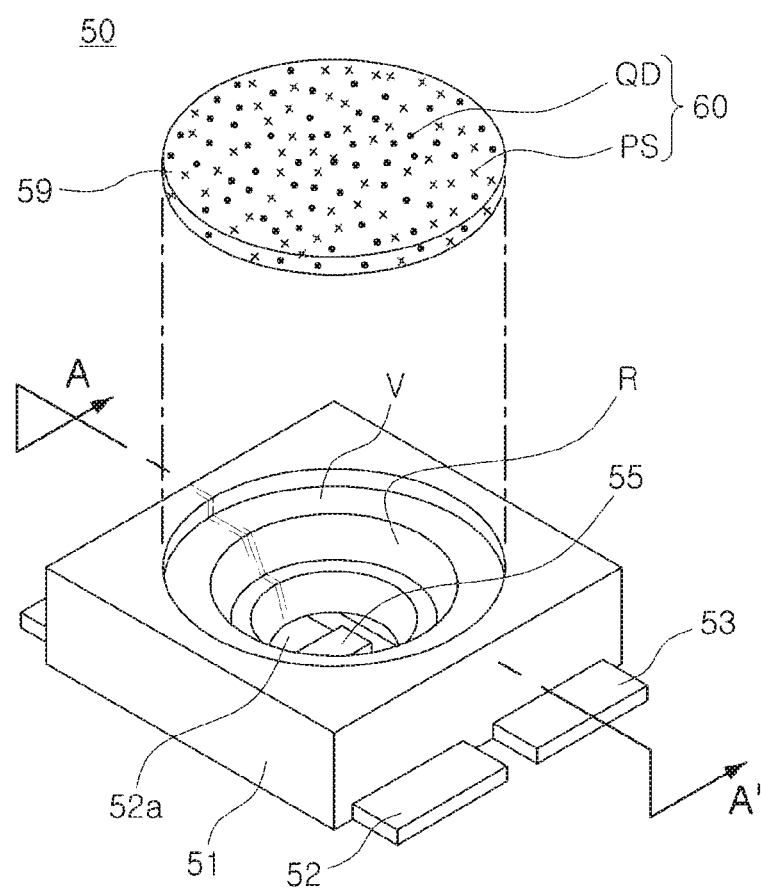
FIG. 8 is a perspective view of a semiconductor light emitting device according to an example embodiment.
Figure 9:
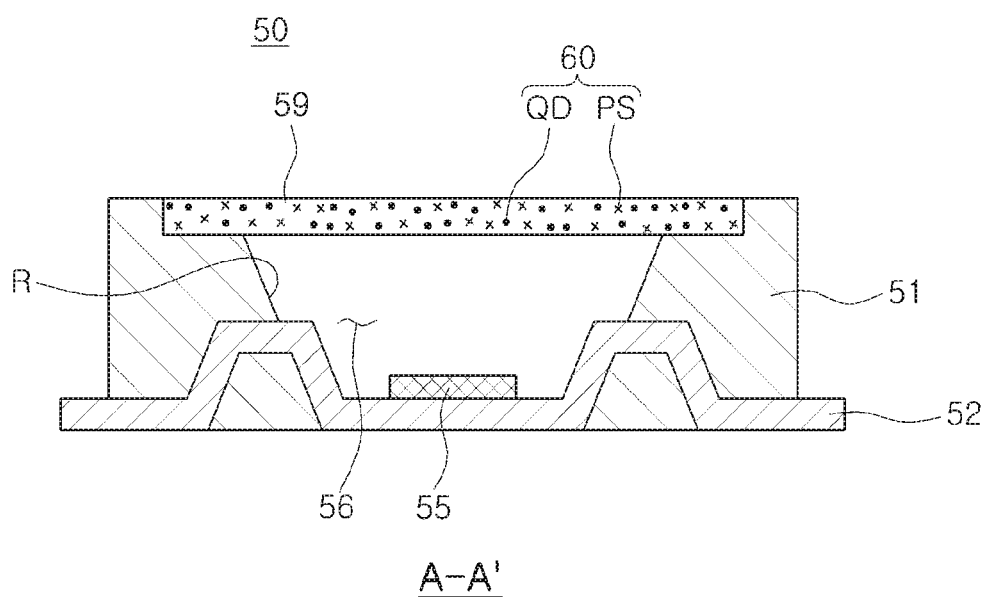
FIG. 9 is a side cross-sectional view of the semiconductor light emitting device illustrated in FIG. 8.

The semiconductor light emitting device according to example embodiments may have various package structures. FIG. 8 is a perspective view of a semiconductor light emitting device according to an example embodiment.

Referring to FIG. 8, a semiconductor light emitting device 50 according to example embodiments may include a package body 51, a semiconductor light emitting diode chip 55, and a wavelength-converting film 60.

The package body 51 according to example embodiments may include first and second electrode structures 52 and 53. The package body 51 may include an upwardly opened concave portion R, and the first and second electrode structures 52 and 53 may be partially exposed through the concave portion R. The semiconductor light emitting diode chip 55 may be mounted on the package body 51 to be electrically connected to the first and second electrode structures 52 and 53.

As illustrated in FIG. 8, a mounting surface 52*a* may be formed by bending the first electrode structure 52, and the semiconductor light emitting diode chip 55 may be mounted on the mounting surface 52*a*. Unlike the semiconductor light emitting diode chips (flip chip structures) of the above-described example embodiments, the semiconductor light emitting diode chip 55 may be mounted in a face-up manner and connected to the second electrode structure 53 through a wire. As necessary, a transparent resin 56 may be disposed on the concave portion R to surround the semiconductor light emitting diode chip 55. The first and second electrode structures 52 and 53 as well as the package body 51 according to example embodiments may be modified to have various forms.

The wavelength-converting film 60 may be disposed on a path of light emitted by the semiconductor light emitting diode chip 55. In example embodiments, the wavelength-converting film 60 may be disposed on the concave portion R of the package body 51. As illustrated in FIG. 8, the wavelength-converting film 60 may be easily mounted using an engaging shoulder v formed on an upper end of the concave portion R of the package body 51.

The wavelength-converting film 60 according to example embodiments may include a glass sintered body G containing a quantum dot QD and a ceramic fluorescent substance PS. For example, light generated in the semiconductor light emitting diode chip 55 may be ultraviolet light, near-UV light, or blue light. In this case, the quantum dot QD may be a green or red quantum dot, and the ceramic fluorescent substance PS may convert the light generated in the semiconductor light emitting diode chip 55 into light having a different wavelength. For example, the ceramic fluorescent substance PS may include at least one selected from the group consisting of a green fluorescent substance, a yellow fluorescent substance, a golden yellow fluorescent substance, and a red fluorescent substance.

The glass sintered body G according to example embodiments may include a $SnO_2$—$P_2O_5$—$SiO_2$-based composition. For example, a transition temperature Tg of the glass composition may be in a range of 100° C. to 300° C., and a molding temperature Tw of the glass composition may be in a range of 150° C. to 400° C. Since the glass composition is sintered at a temperature of 300° C. or lower, deterioration of the wavelength-converting material, such as the quantum dot QD and the ceramic fluorescent substance PS, during the sintering process for forming the wavelength-converting film 60 may be sufficiently reduced or prevented.

As described above, since the glass composition of the wavelength-converting film 60 according to example embodiments includes a Sn component as a condition for sintering at a low temperature, a protective layer that does not contain S or Se may be formed on a surface of the quantum dot QD in order to reduce or prevent the Sn component from reacting with S and Se contained in the shell of the quantum dot (please refer to FIGS. 4A and 4B). As the protective layer of the quantum dot QD, not only an inorganic coating material such as an oxide or nitride but also an organic coating material having thermal resistance at the sintering temperature may be used.

The wavelength-converting film 60 according to example embodiments may further include a ceramic fluorescent substance PS, in addition to the quantum dot QD having a core-shell structure, in the glass sintered body G. For example, the ceramic fluorescent substance PS may be a red nitride fluorescent substance or red fluoride fluorescent substance having relatively low thermal stability. For example, the red ceramic fluorescent substance may be at least one of $MAlSiN_x$:Eu ($1 \le x \le 5$) and $M_2Si_5N_8$:Eu. Here, M may be at least one of Ba, Sr, Ca, and Mg. In addition, the red ceramic fluorescent substance may include a fluoride fluorescent substance represented by a composition formula $A_xMF_y$:$Mn^{4+}$, in which A is at least one selected from Li, Na, K, Rb, and Cs, M is at least one selected from Si, Ti, Zr, Hf, Ge, and Sn, and the composition formula satisfies 2≤x≤3 and 4≤y≤7. For example, the fluoride fluorescent substance may be $K_2SiF_6:Mn^{4+}$.

The wavelength-converting films 20 and 60 according to the above-described example embodiments are illustrated as being in contact with a surface of the semiconductor light emitting diode chip or being disposed on another structure (the package body). However, the wavelength-converting films 20 and 60 may be disposed on another appropriate location as long as it is disposed on a path of light emitted by the semiconductor light emitting diode chip, and the location of the wavelength-converting film may be variously modified according to a package structure.

Figure 10:
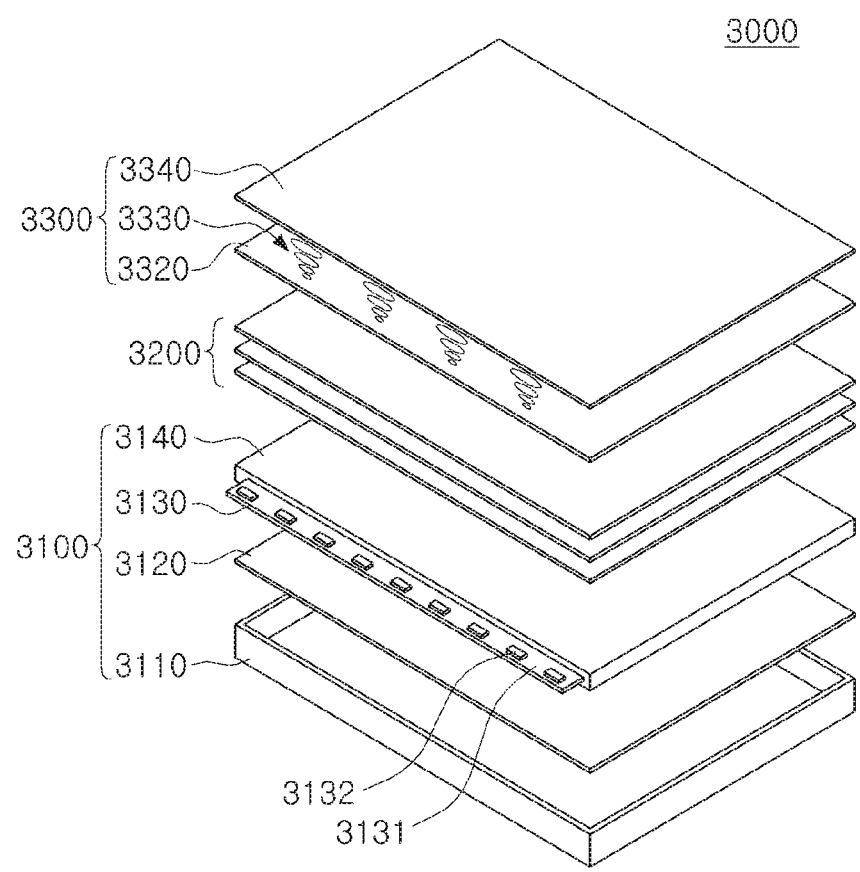
FIG. 10 is an exploded perspective view illustrating a display apparatus according to an example embodiment.

FIG. 10 is an exploded perspective view illustrating a display apparatus according to an example embodiment.

Referring to FIG. 10, a display apparatus 3000 may include a backlight unit 3100, an optical sheet 3200, and an image display panel 3300 such as a liquid crystal panel.

The backlight unit 3100 may include a bottom case 3110, a reflector 3120, a light guide plate 3140, and/or a light source module 3130 disposed on at least one side of the light guide plate 3140. The light source module 3130 may include a printed circuit board (PCB) 3131 and light sources 3132. The light sources 3132 may be the semiconductor light emitting device described above.

The optical sheet 3200 may be disposed between the light guide plate 3140 and the image display panel 3300, and may include various types of sheet, such as a diffusion sheet, a prism sheet, or a protection sheet. The image display panel 3300 may display an image using light emitted by the optical sheet 3200. The image display panel 3300 may include an array substrate 3320, a liquid crystal film 3330, and a color filter substrate 3340. The array substrate 3320 may include pixel electrodes arranged in a matrix form, thin-film transistors for applying a driving voltage to the pixel electrodes, and signal lines for operating the thin-film transistors. The color filter substrate 3340 may include a transparent substrate, a color filter, and a common electrode. The color filter may include filters selectively transmitting light having specific wavelengths in white light emitted by the backlight unit 3100. The liquid crystal film 3330 may be rearranged by an electric field formed between the pixel electrodes and the common electrode to adjust light transmittance. The light having the adjusted light transmittance may pass through the color filter of the color filter substrate 3340 to display the image. The image display panel 3300 may further include a driving circuit unit processing an image signal.

In the display apparatus 3000 according to example embodiments, since the light sources 3132 emitting blue light, green light, and red light which have relatively narrow full widths at half maximum (FWHM), a blue color, a green color, and a red color having high color purities may be implemented after the emitted light passes through the color filter substrate 3340.

Figure 11:
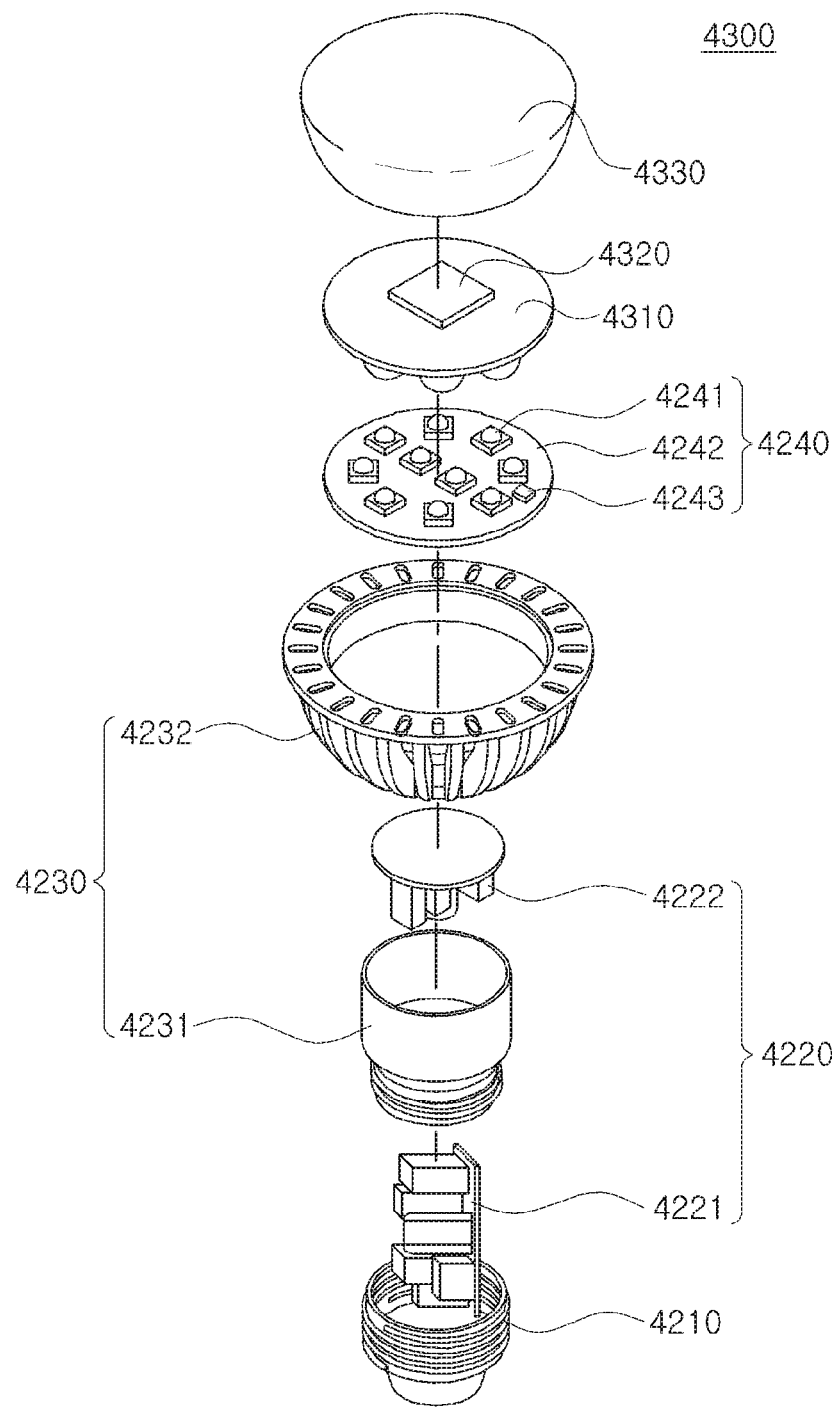
FIG. 11 is an exploded perspective view illustrating a bulb-type lighting apparatus according to an example embodiment.

FIG. 11 is an exploded perspective view illustrating a bulb-type lighting apparatus according to an example embodiment.

The lighting apparatus 4300 illustrated in FIG. 11 may include a socket 4210, a power supply 4220, a heat sink 4230, a light source module 4240, and/or an optical unit 4250. According to example embodiments, the light source module 4240 may include a light-emitting diode array, and the power supply 4220 may include a light-emitting diode driver.

The socket 4210 may be replaced by a normal lighting apparatus. The power supplied to the lighting apparatus 4200 may be applied through the socket 4210. As illustrated in FIG. 11, the power supply 4220 may be separated into a first power supply 4221 and a second power supply 4222. The heat sink 4230 may include an internal heat sink 4231 and an external heat sink 4232. The internal heat sink 4231 may be directly connected to the light source module 4240 and/or the power supply 4220, and may thereby serve to transmit heat to the external heat sink 4232. The optical unit 4250 may include an internal optical unit (not shown) and an external optical unit (not shown), and may be configured to uniformly spread light emitted by the light source module 4240.

The light source module 4240 may receive power from the power supply 4220 to emit light to the optical unit 4250. The light source module 4240 may include one or more light sources 4241, a circuit board 4242, and a controller 4243. The controller 4243 may store driving information of the light sources 4241. The light sources 4241 may include the semiconductor light emitting devices according to the various example embodiments described above.

The lighting apparatus 4300 according to example embodiments may include a reflector 4310 on the light source module 4240. The reflector 4310 may function to uniformly spread light emitted by the light sources 4241 in lateral and rearward directions to reduce glare.

A communications module 4320 may be mounted on the reflector 4310, and home-network communications may be implemented through the communications module 4320. For example, the communications module 4320 may be a wireless communications module using Zigbee®, Wi-Fi, or visible light wireless fidelity (Li-Fi) technology. The communications module 4320 may control functions such as on/off or brightness adjustment of an interior or exterior lighting apparatus by using a smartphone or a wireless controller. In addition, the communications module 4320 may control electronics and automobile systems in and around the home, such as a TV, a refrigerator, an air conditioner, a door lock, or an automobile, by a Li-Fi communications module using a visible wavelength of light of the lighting apparatus installed in and around the home.

The reflector 4310 and the communications module 4320 may be covered by a cover 4330.

Figure 12:
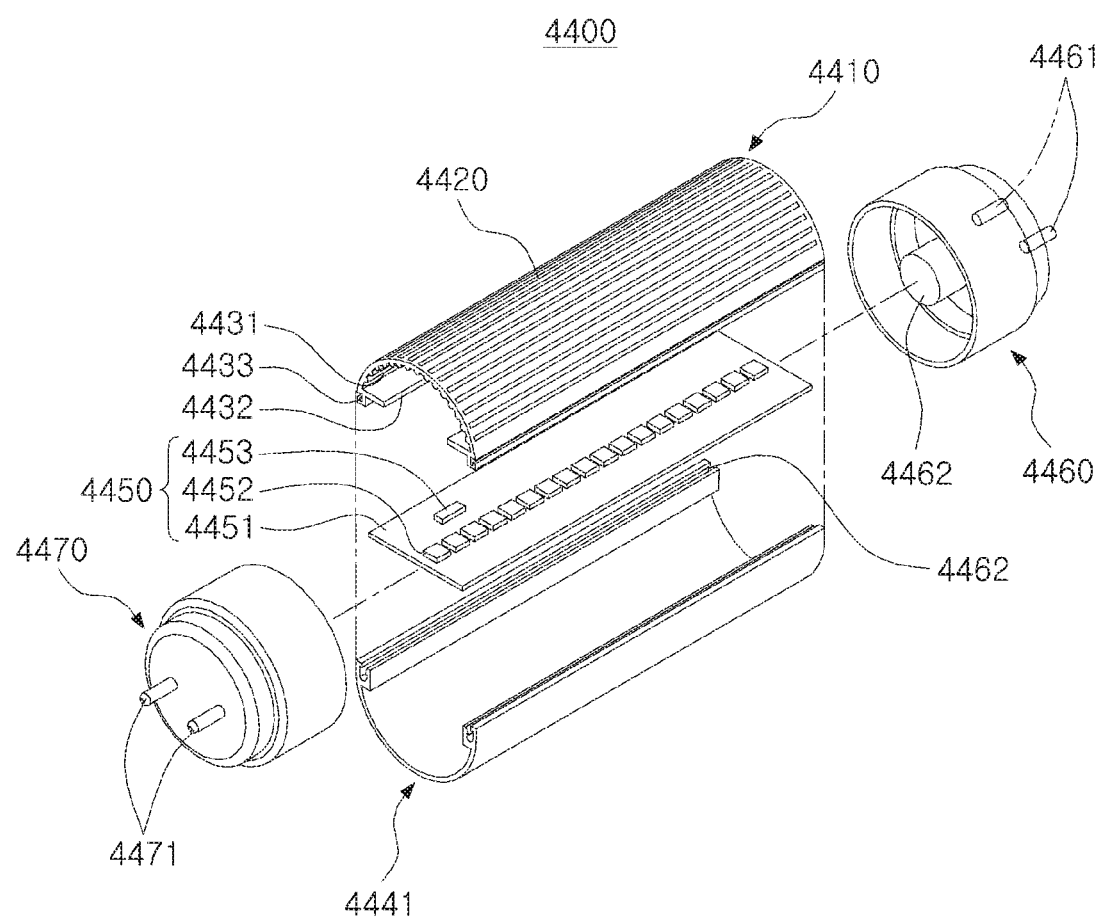
FIG. 12 is an exploded perspective view illustrating a tube-type lighting apparatus according to an example embodiment.

FIG. 12 is an exploded perspective view illustrating a tube-type light apparatus according to an example embodiment.

The lighting apparatus 4400 illustrated in FIG. 12 may include a heat sink unit 4410, a cover 4441, a light source module 4450, a first socket 4460, and/or a second socket 4470. A plurality of heat sink fins 4420 and 4431 may be disposed on an inner surface and/or an outer surface of the heat sink unit 4410 in the form of ridges, and the heat sink fins 4420 and 4431 may be designed to have a variety of shapes and distances therebetween. An overhang-type support 4432 may be formed at an inner side of the heat sink unit 4410. The light source module 4450 may be fastened on the support 4432. A fastening protrusion 4433 may be formed at each end portion of the heat sink unit 4410.

A fastening groove 4442 may be formed in the cover 4441, and the fastening protrusion 4433 of the heat sink unit 4410 may be combined with the fastening groove 4442 in a hook-coupling structure. Positions of the fastening groove 4442 and the fastening protrusion 4433 may be exchanged.

The light source module 4450 may include a light-emitting device array. The light source module 4450 may include a PCB 4451, a light source 4452, and a controller 4453. As described above, the controller 4453 may store driving information of the light source 4452. Circuit interconnections for operating the light source 4452 may be formed on the PCB 4451. In addition, the PCB 4451 may further include other components for operating the light source 4452.

The first and second sockets 4460 and 4470 may be a pair of sockets, and may have a structure combined with both end portions of a cylindrical cover unit formed of the heat sink unit 4410 and the cover 4441. For example, the first socket 4460 may include an electrode terminal 4461 and a power device 4462, and the second socket 4470 may include a dummy terminal 4471. In addition, an optical sensor and/or a communications module may be embedded in one of the first socket 4460 and the second socket 4470. For example, the optical sensor and/or the communications module may be embedded in the second socket 4470 including the dummy terminal 4471. As another example, the optical sensor and/or the communications module may be embedded in the first socket 4460 including the electrode terminal 4461.

As set forth above, a wavelength-converting film using a glass composition in which a wavelength-converting material such as a quantum dot is not deteriorated or discolored and wavelength-converting characteristics are stably maintained in a service environment, may be provided. That is, a wavelength-converting film including the quantum dot having poor moisture resistance and thermal stability can maintain stable wavelength-converting characteristics by employing glass sintered at a lower temperature (e.g. 300° C. or lower).

Further, a semiconductor light emitting apparatus having improved reliability is provided by employing the wavelength-converting film in the semiconductor light emitting apparatus emitting light at higher temperature.

While example embodiments have been shown and described above, it will be apparent to those skilled in the art that modifications and variations could be made without departing from the scope of the present inventive concept as defined by the appended claims.

What is claimed is:

1. A wavelength-converting film, comprising:
   a sintered body including
      a glass composition, and
      a wavelength-converting material located within the glass composition,
   the wavelength-converting material including
      a quantum dot having a core-shell structure and
      a protective layer coating a surface of the quantum dot,
   wherein a shell of the quantum dot contains at least one of S and Se, and the protective layer does not contain S or Se, and
   the glass composition includes a $SnO_2$—$P_2O_5$—$SiO_2$-based composition, and
   wherein the protective layer is configured to prevent direct contact between a Sn component of the glass composition and a S or Se component of the shell.

2. The wavelength-converting film of claim 1, wherein the glass composition includes $SnO_2$ in an amount of 25 to 95 wt %, $P_2O_5$ in an amount of 5 to 70 wt %, and $SiO_2$ in an amount of 1 to 30 wt %, based on a total weight of the glass composition.

3. The wavelength-converting film of claim 2, wherein the glass composition includes at least one selected from the group consisting of $Na_2O$, $MgO$, $Al_2O_3$, $CaO$, $K_2O$, and $Li_2O$, in an amount of 10 wt % or less.

4. The wavelength-converting film of claim 1, wherein a transition temperature (Tg) of the glass composition is in a range of 100° C. to 300° C.

5. The wavelength-converting film of claim 1, wherein a molding temperature (Tw) of the glass composition is in a range of 150° C. to 400° C.

6. The wavelength-converting film of claim 1, wherein the protective layer of the quantum dot is poly(ethylene-co-acrylic acid) or poly(methyl methacrylate) (PMMA).

7. The wavelength-converting film of claim 1, wherein the protective layer of the quantum dot is an oxide or a nitride selected from the group consisting of $SiO_2$, $Al_2O_3$, ZnO, $SiO_xN_y$, and $Si_3N_4$.

8. The wavelength-converting film of claim 1, wherein the quantum dot is one selected from the group consisting of InP/ZnS, InP/ZnSe, CdSe/CdS, CdSe/ZnS, PbS/ZnS, and InP/GaP/ZnS.

9. The wavelength-converting film of claim 8, wherein the quantum dot is a green quantum dot or a red quantum dot.

10. The wavelength-converting film of claim 8, wherein a diameter of the quantum dot is in a range of 5 nm to 20 nm.

11. The wavelength-converting film of claim 8, further comprising:
    a red ceramic fluorescent substance,
    wherein the quantum dot is a green quantum dot.

12. The wavelength-converting film of claim 11, wherein the red ceramic fluorescent substance includes a fluoride fluorescent substance represented by a composition formula $A_xMF_y:Mn^{4+}$, in which A is at least one selected from Li, Na, K, Rb, and Cs, M is at least one selected from Si, Ti, Zr, Hf, Ge, and Sn, and the composition formula satisfies $2 \leq x \leq 3$ and $4 \leq y \leq 7$.

13. The wavelength-converting film of claim 8, wherein the wavelength-converting film has a sheet shape or a plate shape.

14. A semiconductor light emitting device, comprising:
    first and second electrode structures;
    a semiconductor light-emitting diode chip electrically connected to the first and second electrode structures and emitting first light having a peak wavelength in a range of 440 nm to 460 nm; and
    a wavelength-converting film along a path of light generated in the semiconductor light-emitting diode chip and claimed in claim 1, wherein the wavelength-converting film converts the first light into second light having a different peak wavelength from that of the first light.

15. A semiconductor light emitting device, comprising:
    first and second electrode structures;
    a semiconductor light-emitting diode chip electrically connected to the first and second electrode structures and emitting first light having a peak wavelength in a range of 440 nm to 460 nm; and
    a wavelength-converting film along a path of light generated in the semiconductor light-emitting diode chip and including a sintered body including a mixture of a wavelength-converting material configured to convert first light into second light having a different wavelength and a glass composition,
    wherein the wavelength-converting material includes a quantum dot having a core-shell structure and a protective layer coating a surface of the quantum dot,
    a shell of the quantum dot contains at least one of S and Se, and the protective layer does not contain S or Se, and
    the glass composition includes a $SnO_2$—$P_2O_5$—$SiO_2$-based composition, and
    wherein the protective layer is configured to prevent direct contact between a Sn component of the glass composition and a S or Se component of the shell.

16. The semiconductor light emitting device of claim 15, wherein the quantum dot is one selected from the group consisting of InP/ZnS, InP/ZnSe, CdSe/CdS, CdSe/ZnS, PbS/ZnS, and InP/GaP/ZnS.

17. The semiconductor light emitting device of claim 15, wherein the protective layer of the quantum dot is poly (ethylene-co-acrylic acid) or poly(methyl methacrylate) (PMMA).

18. The semiconductor light emitting device of claim 15, wherein the protective layer of the quantum dot is an oxide or a nitride selected from the group consisting of $SiO_2$, $Al_2O_3$, ZnO, $SiO_xN_y$, and $Si_3N_4$.

19. The semiconductor light emitting device of claim 15, wherein the quantum dot includes a green quantum dot and a red quantum dot.

20. The semiconductor light emitting device of claim 19, wherein the quantum dot includes a green quantum dot, and the wavelength-converting film further includes a red ceramic fluorescent substance.

\* \* \* \* \*